US006891751B2

(12) United States Patent
Mikolajick

(10) Patent No.: US 6,891,751 B2
(45) Date of Patent: May 10, 2005

(54) CHARGE TRAPPING MEMORY CELL, METHOD FOR FABRICATING IT, AND SEMICONDUCTOR MEMORY DEVICE

(75) Inventor: Thomas Mikolajick, Dresden (DE)

(73) Assignee: Infineon Technologies AG, Munich (DE)

(*) Notice: Subject to any disclaimer, the term of this patent is extended or adjusted under 35 U.S.C. 154(b) by 155 days.

(21) Appl. No.: 10/283,857

(22) Filed: Oct. 30, 2002

(65) Prior Publication Data

US 2003/0081456 A1 May 1, 2003

(30) Foreign Application Priority Data

Oct. 30, 2001 (DE) .......................... 101 53 561

(51) Int. Cl.[7] .............................................. G11C 16/04
(52) U.S. Cl. ........................... 365/185.01; 365/185.26; 365/185.27
(58) Field of Search ..................... 365/185.01, 185.26, 365/185.27

(56) References Cited

U.S. PATENT DOCUMENTS

| 5,999,453 | A | | 12/1999 | Kawata | 365/185.18 |
| 2001/0021126 | A1 | * | 9/2001 | Lavi et al. | 365/185.03 |
| 2004/0004859 | A1 | * | 1/2004 | Forbes et al. | 365/185.05 |

* cited by examiner

Primary Examiner—Van Thu Nguyen
Assistant Examiner—Pho M. Luu
(74) Attorney, Agent, or Firm—Laurence A. Greenberg; Werner H. Stemer; Gregory L. Mayback

(57) ABSTRACT

For particularly flexible and space-saving information storage, a charge trapping memory cell and a corresponding semiconductor memory device include a charge trapping gate configuration provided with a plurality of charge trapping gates each configured for substantially independent information storage. As a result, a plurality of information units can be stored independently of one another in the memory cell. Also provided is a method for producing such a memory cell.

83 Claims, 12 Drawing Sheets

CHARGE TRAPPING MEMORY CELL, METHOD FOR FABRICATING IT, AND SEMICONDUCTOR MEMORY DEVICE

BACKGROUND OF THE INVENTION

Field of the Invention

The invention relates to a charge trapping memory cell or charge trapping gate memory cell for nonvolatile information storage, a semiconductor memory device having a plurality of memory cells for nonvolatile information storage, and a method for fabricating a charge trapping memory cell for nonvolatile information storage.

In the further development of semiconductor memory devices based upon nonvolatile memory mechanisms, the principle of the so-called nonvolatile charge trapping memory cell or charge trapping gate memory cell has also been developed. Such a charge trapping memory cell for nonvolatile information storage has a charge trapping gate configuration or charge trapping region configuration, a source/drain configuration and a control gate configuration. The charge trapping gate configuration or charge trapping region configuration serves for the actual information storage, while the source/drain configuration is configured for access to the charge trapping gate configuration or charge trapping region configuration and, thus, for access to the respective information. The control gate configuration is configured for controlling this access to the charge trapping gate configuration or charge trapping region configuration and to the information.

In the narrower sense of the invention, the charge trapping gate is understood to be a charge trapping region or charge trapping material region, that is to say, a region, e.g., a layer, made of a material that can form charge trapping states. Hereinafter, for the sake of brevity, the term charge trapping gate is used in this sense unless stated otherwise. Accordingly, the terms charge trapping gate, charge trapping region, and, if appropriate, charge trapping layer are used synonymously in the sense of the invention. In the broader sense, charge trapping gate means the configuration of charge trapping region, if appropriate, insulation region and control gate.

What is disadvantageous in the case of prior art semiconductor memory devices, memory cells contained therein and corresponding fabrication methods for semiconductor memory devices or memory cells is that their fundamental concept, from a structural and production engineering standpoint, is based on the provision of a single binary information unit in each individual memory cell. Each memory cell and, thus, each memory location are, thus, occupied only singly with information and configured accordingly.

SUMMARY OF THE INVENTION

It is accordingly an object of the invention to provide a charge trapping memory cell, method for fabricating it and semiconductor memory device that overcome the hereinafore-mentioned disadvantages of the heretofore-known devices and methods of this general type and that by which, in a particularly simple manner, a particularly high information density can be obtained and can be modified and retrieved in a particularly reliable manner.

With the foregoing and other objects in view, there is provided, in accordance with the invention, a charge trapping memory cell for nonvolatile storage of information including at least one of information units and binary bits, including a charge trapping gate configuration for storing the information, the charge trapping gate configuration having charge trapping gates each substantially independently storing the information and, as a result, storing a corresponding plurality of one of the information units and binary bits independently of one another in the memory cell, a source/drain configuration accessing the charge trapping gate configuration, and a control gate configuration controlling access to the charge trapping gate configuration.

With the objects of the invention in view, there is also provided a charge trapping memory cell for nonvolatile storage of information including at least one of information units and binary bits, including a charge trapping gate configuration for storing the information, the charge trapping gate configuration having charge trapping gates each substantially independently storing the information and, as a result, storing a corresponding plurality of one of the information units and binary bits independently of one another in the memory cell, a source/drain configuration connected to the charge trapping gate configuration and accessing the charge trapping gate configuration, and a control gate configuration connected to the charge trapping gate configuration and controlling access to the charge trapping gate configuration.

With the objects of the invention in view, there is also provided a semiconductor memory device, including charge trapping gate memory cells for nonvolatile storage of information including at least one of information units and binary bits, each of the memory cells having a charge trapping gate configuration having charge trapping gates each substantially independently storing the information and, as a result, storing a corresponding plurality of one of the information units and binary bits independently of one another in the memory cells, a source/drain configuration accessing the charge trapping gate configuration, and a control gate configuration controlling access to the charge trapping gate configuration.

The invention's charge trapping memory cell or charge trapping gate memory cell for nonvolatile information storage is characterized in that the charge trapping gate configuration has a plurality of charge trapping gates, in that each of the charge trapping gates is configured for substantially independent information storage, and in that, as a result, a corresponding plurality of information units, in particular, binary bits, can be stored independently of one another in the memory cell.

Thus, in contrast to the prior art, the invention departs from the 1-bit concept and, consequently, the charge trapping gate memory cell according to the invention is configured for storing a plurality of information units, in particular, binary bits or the like. The configuration is realized by virtue of the fact that, in contrast to the charge trapping gate memory cell according to the prior art, the charge trapping gate configuration is configured with a plurality of charge trapping gates. In such a case, each of the charge trapping gates is configured for separate and independent information storage independently of the other charge trapping gates. By way of example, in each case two bits can be written and retrieved, in accordance with an impressed potential state, in each of the charge trapping regions or charge trapping gates.

To that end, each charge trapping gate can also be configured for locally taking up or assuming more than two charge and/or potential states, thereby further increasing the information density per charge trapping memory cell, e.g., by virtue of the fact that more than two bits can be stored per charge trapping region or gate.

The structure of the charge trapping gate memory cell according to the invention is configured particularly flexibly if, in accordance with another feature of the invention, the control gate configuration has a plurality of control gates, a respective control gate is assigned to a respective charge trapping gate and the information states contained therein, and the access to the assigned charge trapping gate is controllable by each control gate. The initially organizational assignment of a respective control gate of the control gate configuration with a respective charge trapping gate of the charge trapping gate configuration results in particularly flexible control of the access to the information to be stored in the charge trapping gate. The initially organizational and sequence-technical assignment between charge trapping gate and control gate will advantageously also be represented in a structural or spatial assignment, in particular, in a particular spatial proximity of the assigned charge trapping gates and control gates with respect to one another.

A further simplification of the charge trapping gate memory cell according to the invention results if the source/drain configuration has two source/drain regions, the source/drain regions are provided jointly for the plurality of charge trapping gates and/or for the plurality of control gates, and, as a result, all the charge trapping gates are accessible through the two common source/drain regions.

With regard to a particularly simple fabrication procedure and also with regard to a corresponding functional reliability, the charge trapping gates are configured substantially identically with regard to their geometrical and/or material properties.

For the reliability of the charge trapping gate memory cell according to the invention, on the other hand, the charge trapping gates are disposed and configured in a manner substantially electrically insulated from one another, from the control gates, and from the source/drain regions. In particular, each charge trapping gate in the charge trapping gate memory cell can be assigned and disposed in a substantially capacitively coupled manner. This is expedient, e.g., when the charge trapping region is formed by electrically conductive islands embedded in an electrically insulating matrix.

Furthermore, it is advantageous that the control gates are configured substantially identically with regard to their geometrical and/or material properties.

It is further preferred that the control gates are disposed and configured in a manner substantially electrically insulated from one another, from the charge trapping gates and from the source/drain regions.

In accordance with another embodiment of the charge trapping gate memory cell according to the invention, the control gates are composed of a polysilicon material, polycide, metal, and/or the like.

In a further embodiment of the charge trapping gate memory cell according to the invention, the charge trapping gates or charge trapping regions are substantially composed of a material in which charge trapping states can be formed. The material is preferably intended to have or to form a sufficient density of defects that can be occupied by electrons and/or holes. The charge trapping region is, in particular, an insulator, e.g., made of silicon nitride.

It is provided, in particular, that the charge trapping gates have, form or are formed from an ONO structure, NO structure, or the like, that is to say, from a sequence of nitride/oxide/nitride or nitride/oxide. In such a case, the nitride is present as the actual charge trapping layer. The oxide serves to insulate the actual charge trapping layer, e.g., the nitride, from the control gate and/or from the channel region. An insulation layer above and/or below the actual charge trapping layer produces an additional potential barrier with respect to the control gate or the channel region. $Al_2O_3$, $Ta_2O_5$, $HfO_2$, and/or the like can also serve as the charge trapping region.

To realize the assignment between the charge trapping gates and the control gates, in accordance with a further feature of the invention, the mutually assigned charge trapping gates and control gates are in each case configured in direct spatial proximity to one another, and that, in particular, respective intermediate insulation regions are provided in such a case, if appropriate, in particular, in each case an intermediate dielectric between the respectively assigned charge trapping gates and the control gate.

In particular, in an edge region or a periphery of a memory cell configuration with a plurality of cells, it is preferred that each charge trapping gate has a first end region and/or a second end region. In such a case, the respective first end region is configured and disposed in direct spatial proximity to the first source/drain region and the respective second end region is configured and disposed in direct spatial proximity to the second source/drain region. As a result, in particular, a spatial or areal overlap is formed between the charge trapping gates, in particular, the respective end regions thereof, and the source/drain regions. Outside the edge regions, that is to say, in the interior of the memory cell configuration, the charge trapping layer is formed in each case continuously, that is to say, with no end regions.

In accordance with an added feature of the invention, an insulation region, in particular, in the form of a silicon dioxide material, is provided between the respective charge trapping gate, in particular, the end regions thereof, and the source/drain regions.

In accordance with an additional feature of the invention, a main region of the charge trapping gate cell is formed, to be precise as an elevated region, in particular, as a lamella, a web, a burr, or the like, of a semiconductor material region.

In such a case, the main region, in particular, the lamella, advantageously has side regions. Furthermore, in such a case the, in particular, two, charge trapping gates are provided in the region of the side regions, in particular, in a manner lying opposite one another with the main region in between, in particular, in direct spatial proximity thereto with provision in each case of an insulation region toward the main region.

The provision of such a lamellar region with side regions results practically automatically in an electrical insulation and spatial separation between the charge trapping gates to be formed, on one hand, and between the control gates to be formed, on the other hand.

In accordance with yet another feature of the invention, the source/drain regions are configured as—in particular, $n^+$-doped or $p^+$-doped—regions of the main region isolated, in particular, by a channel region as part of the main region. Although n-channel transistors are preferred, p-channel transistors are, nevertheless, possible and provided. In such a case, source/drain regions are, then, configured to be $p^+$-doped.

Such a procedure with the configuration as lamella, thus, additionally automatically enables the formation of source/drain regions that are spatially separate from one another and substantially electrically insulated from one another.

Furthermore, by virtue of its linear extent and by virtue of the possibility of disposing a plurality of such lamellae parallel to one another, the lamellar structure enables a particularly simple procedure when configuring a semiconductor memory device with a plurality or multiplicity of charge trapping gate memory cells according to the invention.

Thus, in the case of the invention's semiconductor memory device having a plurality of memory cells for nonvolatile information storage, the memory cells are configured as charge trapping gate memory cells according to the invention.

In accordance with yet a further feature of the invention, adjacent memory cells use at least some of the control gates as common control gates.

In accordance with yet an added feature of the invention, the plurality of memory cells is configured in a matrix-like manner and on a plurality of substantially identical main regions, in particular, in the form of lamellae, webs, burrs, or the like.

The design and structure of the semiconductor memory device according to the invention is configured particularly advantageously if the main regions are configured and disposed in a manner extending linearly and substantially equidistantly with respect to one another.

In such a case, the main regions, in particular, the lamellae, are provided substantially as columns and/or as rows of the matrix-like configuration of memory cells.

The invention's method for fabricating a charge trapping gate memory cell for nonvolatile information storage is presented below. A fabrication method of the generic type is used as a basis in such a case. In the case of the method of the generic type, a charge trapping gate configuration, a source/drain configuration and a control gate configuration are provided. The charge trapping gate configuration is configured for the actual information storage. The source/drain configuration is configured for access to the charge trapping gate configuration. The control gate configuration is configured for controlling the access to the charge trapping gate configuration and to the information contained therein.

With the objects of the invention in view, there is also provided a method for fabricating a charge trapping memory cell for nonvolatile storage of information, including the steps of providing a charge trapping gate configuration for storing information including at least one of information units and binary bits, the charge trapping gate configuration having charge trapping gates each storing the information substantially independently of one another in the memory cell and, as a result, storing the information independently of one another in the memory cell, accessing the charge trapping gate configuration with a source/drain configuration, and controlling the access to the charge trapping gate configuration with a control gate configuration.

The invention's method for fabricating a charge trapping gate memory cell is characterized by configuring the charge trapping gate configuration with a plurality of charge trapping gates, in that each of the charge trapping gates is configured for substantially independent information storage, and in that, as a result, a corresponding plurality of information units, in particular, binary bits or the like, can be stored independently of one another in the memory cell.

In a particularly preferred embodiment of the fabrication method according to the invention, the control gate configuration is provided having a plurality of control gates, a respective control gate is assigned to a respective charge trapping gate, and the access to the assigned charge trapping gate is configured to be controllable by each control gate.

On the other hand, the source/drain configuration is provided having two source/drain regions, the source/drain regions are provided jointly for the plurality of charge trapping gates and/or for the plurality of control gates, and, as a result, all the charge trapping gates are accessible through the two common source/drain regions.

In accordance with yet an additional mode of the invention, in each case the charge trapping gates and/or in each case the control gates are configured substantially identically with regard to their geometrical and/or material properties.

It is furthermore preferred that the charge trapping gates and/or the control gates are disposed and configured in a manner substantially electrically insulated from one another, from the control gates, and/or from the charge trapping gates and from the source/drain regions.

In the case of the charge trapping gates, in particular, when using conductive islands in an insulator, it is preferred that they are configured and disposed in a substantially capacitively coupled manner in the charge trapping gate memory cell by virtue of these measures.

In particular, the charge trapping gates are substantially formed from a material in which the charge trapping states can be formed.

In particular, a region made of silicon nitride is provided as the charge trapping region. The use of an ONO or NO structure or the like is, preferably, provided in such a case.

The control gates are preferably formed from a polysilicon material, a polycide, a metal, and/or the like.

It is advantageous to construct the control gate in each case with low impedance. By contrast, the charge trapping gates are configured with high impedance, in particular, as an insulator.

To realize the assignment between the respective charge trapping gates and the respective control gates, the mutually assigned charge trapping gates and control gates are in each case formed in direct spatial proximity to one another, and, in such a case, in particular, an additional intermediate insulation region, in particular, an intermediate dielectric, is in each case provided, if appropriate.

In particular, in the edge region of a configuration of a plurality of cells, each charge trapping gate is configured with a first end region and with a second end region. The respective first end region is configured or disposed in direct spatial proximity to the first source/drain region and the respective second end region is configured or disposed in direct spatial proximity to the second source/drain region. As a result, in particular, a spatial or areal overlap is formed between the charge trapping gates, in particular, the respective end regions thereof, and the source/drain regions. Preferably, an insulation region, in particular, in the form of a silicon dioxide material, is, furthermore, formed between the respective charge trapping gates, in particular, the end regions thereof, and the respective source/drain region.

It is particularly preferred that in each case an elevated region, in particular, a lamella, a web, a burr, or the like, of a semiconductor material region is provided as a main region of the charge trapping cell. In such a case, the main region, in particular, the lamella or the like, is formed with side regions. Furthermore, charge trapping gates—in particular, two—are provided in the region of the side regions, in particular, in a manner lying opposite one another with the main region in between, in particular, in direct spatial proximity thereto with provision in each case of an insulation region toward the main region.

It is particularly advantageous that the source/drain regions are configured as—in particular, $n^+$-doped or $p^+$-doped regions of the main region, isolated, in particular, by a channel region as part of the main region.

The previous characterizing features of the fabrication method according to the invention represent, in part, the structural features of the charge trapping gate memory cell to be formed according to the invention. However, different configurations are additionally conceivable during the fabrication.

In accordance with again another mode of the invention, first, a semiconductor substrate region, in particular, in the form of p-doped silicon, is provided. Local doping regions, in particular, in $n^+$-doped form, are, then, formed for the source/drain regions to be formed, in particular, by implantation. Afterward, the main region for the memory cell is formed by etching back the surroundings in the semiconductor material region, in particular, using a masking process or the like.

It is also possible to use n-doped silicon, in which case $p^+$-doped source/drain regions are to be provided.

The last two steps mentioned can also be carried out with their order reversed so that, first, the main regions, that is to say, in particular, the lamellar structure, is formed by etching back the surroundings in the semiconductor material region, in particular, using a masking process or the like, and, then, doping regions in local form are subsequently formed, in particular, by implantation.

Advantageously, the local doping regions are formed in a first strip form, and the etching back is effected in a second strip form, transversely with respect to the first strip form.

Particularly advantageous structures result if, in accordance with again a further mode of the invention, the main region is configured to be linear and/or approximately parallelepipedal. This can be effected by skillful process control during etching back.

An insulation layer is, then, formed or deposited substantially conformally, in particular, made of a silicon dioxide material and/or, in particular, for the insulation region between the main region and the charge trapping gates to be formed.

It is furthermore provided as an alternative that the insulation layer is formed by being grown.

Afterward, a material region is formed, in particular, deposited, for the charge trapping gates to be formed. In such a case, in particular, an ONO structure, NO structure, or the like is used, i.e., a sequence of oxide/nitride/oxide or nitride/oxide.

In an advantageous manner, the material for the charge trapping gates can remain substantially unpatterned. However, it is also possible for the charge trapping gates subsequently to be patterned, in particular, by etching columns into the material region for the charge trapping gates. In such a case, the columns are formed to run perpendicular to the direction of extent of the main region, that is to say, for example, of the lamella. This is followed by removal or etching back of the material region for the charge trapping gates to a point below the level of a surface region of the main region, for example, of the lamella so that the material region or the material for the charge trapping gates remains only in the region of the side regions of the main region.

Afterward, a material region may optionally be formed or deposited substantially over the whole area and/or conformally, in particular, for an intermediate insulation region that is optionally to be formed between assigned charge trapping gates and control gates.

Afterward, a material region is formed or deposited substantially over the whole area and/or conformally, in particular, for the control gates to be formed.

Afterward, the control gates are patterned—in particular, in the edge region of a memory matrix—in particular, by etching columns running substantially perpendicular to the extent of the main region, and by subsequent removal or etching back of the material region for the control gates to a point below the level of the surface region of the material region for the charge trapping gates and/or, if appropriate, to a point below the level of the surface region of the material region for the intermediate insulation region so that the material region for the control gates remains only in the region of the side regions of the main region, in particular, the material regions for the charge trapping gates and/or, if appropriate, for the intermediate insulation region not being removed.

Preferably, the structure so obtained is embedded in an insulation region and subsequently formed with a contact connection to the source/drain regions and/or the control gates.

The above-described and further aspects of the present invention are also explained based upon the remarks in the following text.

In flash memory cells, it is possible to store a plurality of bits per cell by storing different charge states or by storing a respective bit at spatially separate locations. The last-mentioned possibility necessitates the use of a so-called charge trapping device. This means, for example, that the charge is stored in a nitride layer. What is disadvantageous in such a case, in particular, is that the storage capacity per cell remains limited to two bits.

The present invention presents a different approach, in which a charge trapping gate memory cell can be realized for storing more than two bits in one cell.

The storage of two bits in one flash cell has been realized, heretofore, either by the use of an $Si_3N_4$ layer (NROM concept). Floating gate cells have, heretofore, used exclusively the storage of a plurality of charge states in a floating gate for storing a plurality of bits in one cell.

By fabricating Si lamellae as cell main regions, it is possible to realize a charge trapping gate cell that has two or more charge trapping gates but is supplied through the same source and drain regions. As a result, one or even a plurality of bits can be stored in each of the two charge trapping gates. Consequently, it is possible to realize a charge trapping memory cell that has four overlap regions between source and drain pn junction and NO or ONO but is supplied through the same source and drain regions. As a result, one bit can be stored in each overlap region of source/drain and NO or ONO. Overall, it is, thus, possible to store four bits spatially separately from one another.

A core idea is that the channel of the transistor is shifted from the Si surface to the surface of an Si lamella. This makes it possible to form, at two locations of the lamella, a respective charge trapping gate and, thus, at least one double cell with at least four overlap regions, that is to say, four bits, and, thus, to store four or more bits in the cell.

The function of the memory cell is explained in the following text.

If the component, that is to say, the charge trapping gate memory cell, is processed in the manner described below, then, an inversion channel can be produced at the left-hand and right-hand sides of the component both with the first control gate and with the second control gate. Each of these channels can be utilized as a separate memory cell area with two bits in each case, because the gate voltage can be set separately for each side of the component during programming and erasure. During programming, the methods are possible by hot electrons. For erasure, a band-to-band tunneling current generates hot electrons. The programming by hot electrons can be carried out either jointly for each pair of bits assigned to a source/drain region or separately for each bit.

It is a significant innovation in the case of such a component that although two gate regions are available for storage and driving, they are supplied only by in each case a common source/drain region.

The following scheme can be used, e.g., during programming, erasing, reading:

| Function | SD1 | SD2 | C1 | C2 |
|---|---|---|---|---|
| Programming Bit1 | GND | VPD | VPG | GND |
| Reading Bit1 | VRD | GND | VRG | GND |
| Erasing Bit2 | float | VED | VEG/GND | GND |
| Programming Bit2 | VPD | GND | VPG | GND |
| Reading Bit2 | GND | VRD | VRG | GND |
| Erasing Bit2 | VED | float | VEG/GND | GND |
| Programming Bit3 | GND | VPD | GND | VPG |
| Reading Bit3 | VRD | GND | GND | VRG |
| Erasing Bit3 | float | VED | GND | VEG/GND |
| Programming Bit4 | VPD | GND | GND | VPG |
| Reading Bit4 | GND | VRD | GND | VRG |
| Erasing Bit4 | VED | float | GND | VEG/GND | where, e.g., VPD = 4 V, VPG = 9 V, VRD = 2 V, VRG = 3 V, VED = 5 V, VEG = −7 V, and GND = 0 V.

The fabrication of a memory cell according to the invention is described below. The incorporation of a memory cell into an array is possible in a plurality of architectures (common ground NOR, virtual ground NOR etc.). The latter differ in each case by the extent to which one of the source/drain regions is additionally utilized by further cells and, therefore, if appropriate, need not be separately contact-connected. The incorporation into different array architectures is effected analogously to conventional flash cells. Equally, the contact connection of the control gates is not described below. Such a contact connection is effected, in principle, at the array edge, and both control gates can be contacted-connected on one side, or the control gates can be contact-connected on respectively opposite sides of the array.

Other features that are considered as characteristic for the invention are set forth in the appended claims.

Although the invention is illustrated and described herein as embodied in a charge trapping memory cell, method for fabricating it and semiconductor memory device, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

In the figures of the drawings, unless stated otherwise, identical reference symbols denote identical parts.

Figure 1A:
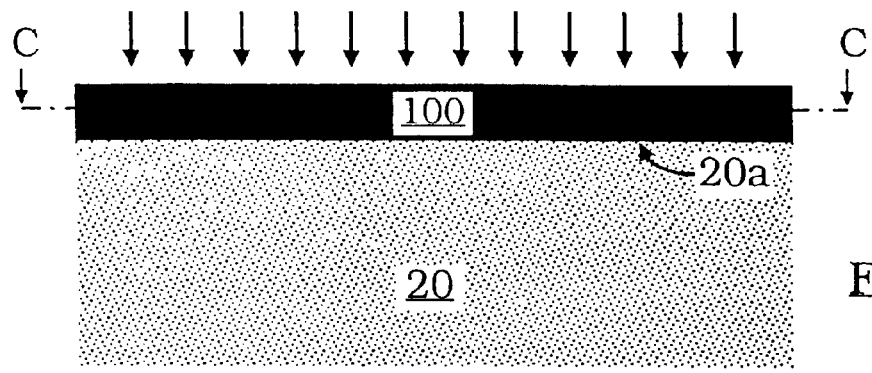
FIG. 1A is a cross-sectional side view of an intermediate state reached in the fabrication method according to the invention along the sectional plane A—A of FIG. 1C.
Figure 1B:
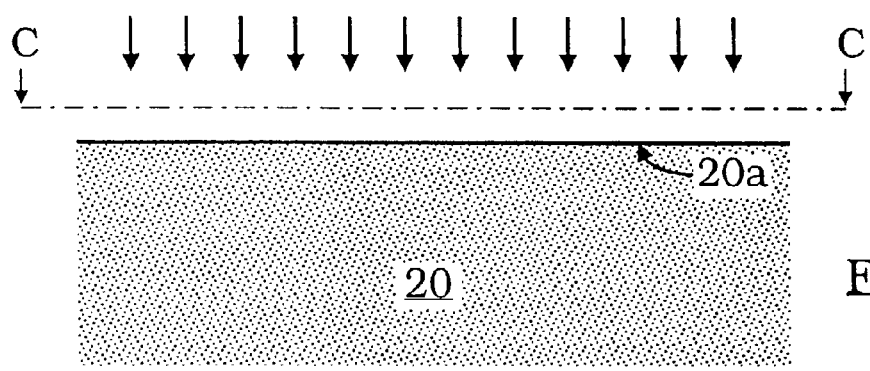
FIG. 1B is a cross-sectional side view of an intermediate state reached in the fabrication method according to the invention along the sectional plane B—B of FIG. 1C.
Figure 1C:
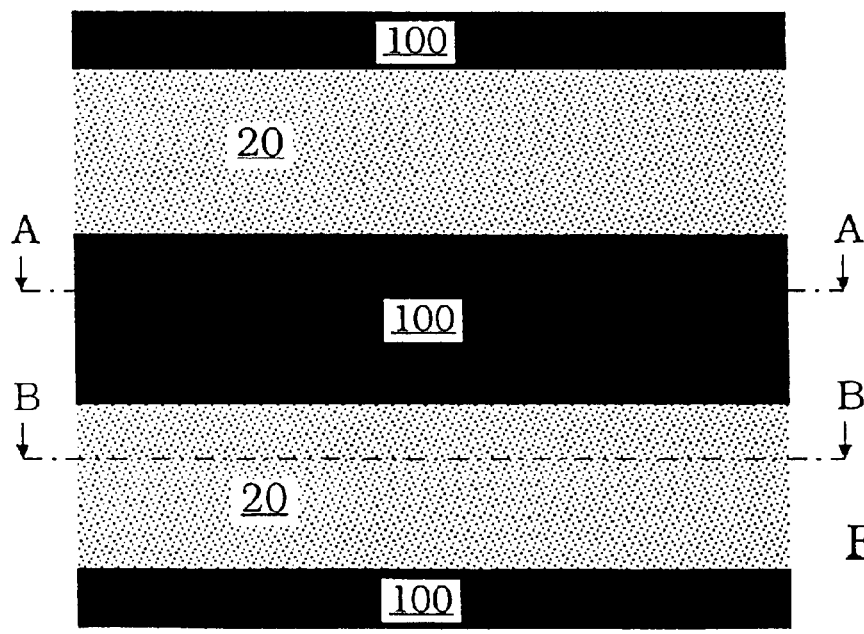
FIG. 1C is a cross-sectional plan view of an intermediate state reached in the fabrication method according to the invention along the sectional plane C—C of FIGS. 1A and 1B.

Referring now to the figures of the drawings in detail and first, particularly to FIGS. 1A to 1C thereof, there is shown, in lateral cross-sectional view and in plan view, a first intermediate state of an embodiment of the fabrication method according to the invention. A semiconductor substrate region 20 with a substantially planar surface 20a is provided. The semiconductor substrate region or material region 20 may be a p-doped (or n-doped) silicon material or the like. The latter may already be processed and provided, e.g., with suitable wells. Mask regions 100, which serve to form corresponding doping regions 21 (see, i.e., FIGS. 2A to 2C), are applied in strip form by implantation in the arrow direction.

Figure 2A:
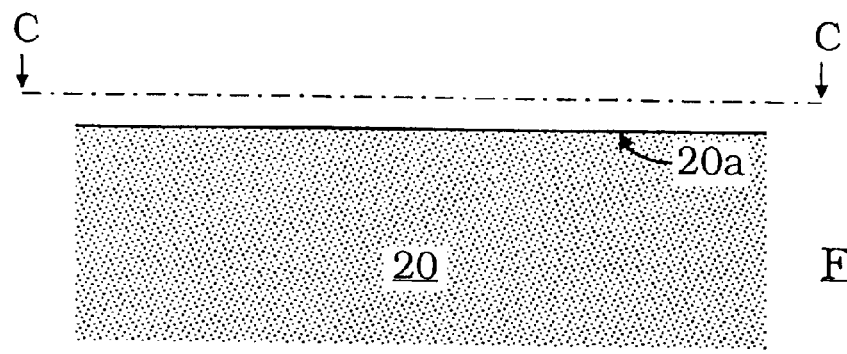
FIG. 2A is a cross-sectional side view of an intermediate state reached in the fabrication method according to the invention along the sectional plane A—A of FIG. 2C.
Figure 2B:
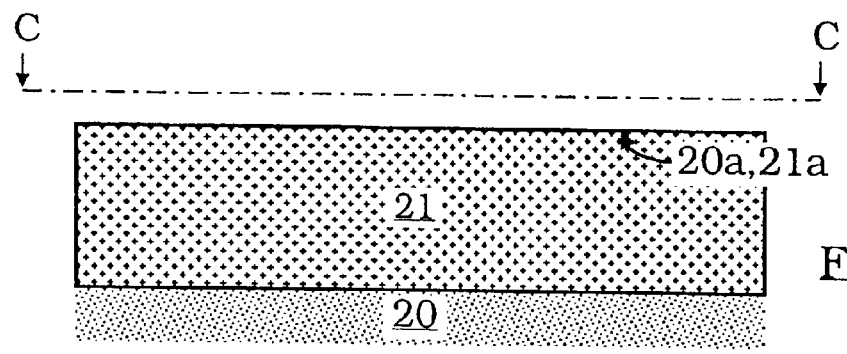
FIG. 2B is a cross-sectional side view of an intermediate state reached in the fabrication method according to the invention along the sectional plane B—B of FIG. 2C.
Figure 2C:
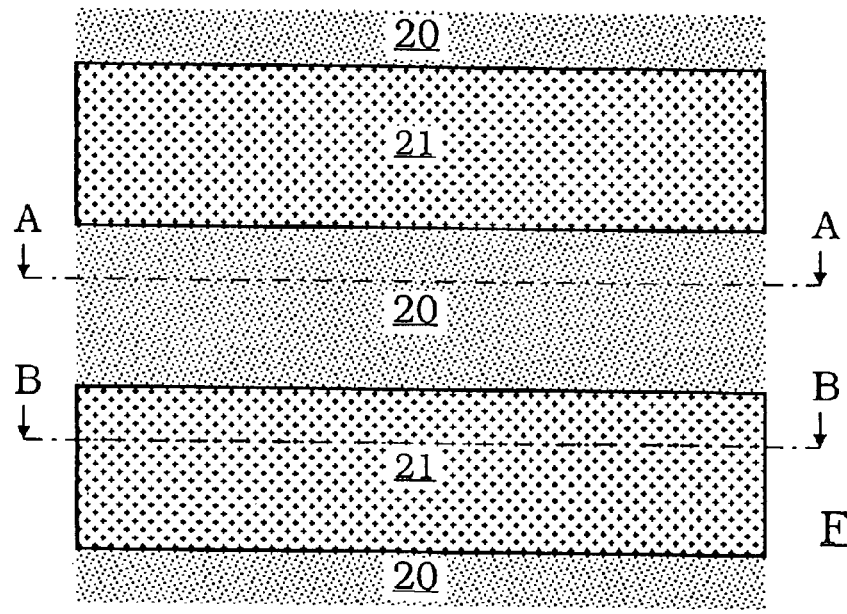
FIG. 2C is a cross-sectional plan view of an intermediate state reached in the fabrication method according to the invention along the sectional plane C—C of FIGS. 2A and 2B.
Figure 3A:
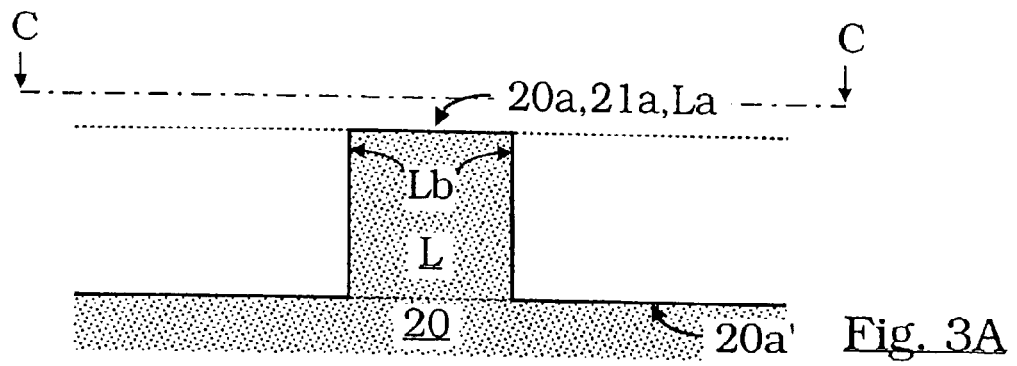
FIG. 3A is a cross-sectional side view of an intermediate state reached in the fabrication method according to the invention along the sectional plane A—A of FIG. 3C.

In the transition to the intermediate state shown in FIGS. 2A to 2C, a doping region 21 is formed locally in the surface region 20a of the semiconductor material region 20 and to a certain depth underneath, for example, in the form of an $n^+$-doped (or $p^+$-doped) silicon material region, by a corresponding implantation technique. The doping regions 21 formed have a substantially planar surface 21a. FIG. 2C shows a plan view of the locally doped semiconductor material 20, and FIGS. 2A and 2B show corresponding cross-sectional side views along the sectional planes A—A and B—B, respectively. The formation of the doping regions 21 results in the creation, by implantation, of a precursor of the source/drain regions SD1 and SD2 (see, i.e., FIGS. 3A to 3C) to be formed for each of the charge trapping gate memory cells 10 (see, i.e., FIG. 8C).

Afterward, the semiconductor material 20 with the corresponding doping regions 21 is patterned, thereby producing corresponding silicon lamellae L as main regions L for the charge trapping gate memory cells 10 to be formed. As emerges from the plan view of FIG. 3C and the sectional side views of 3A and 3B, the lamella L has, as main region L, a substantially linearly extended parallelepiped structure with side regions Lb and a surface region La, which is configured to be substantially planar. By the etching process, in the transition to the intermediate state shown in FIGS. 3A to 3C, the surface region 20a of the semiconductor substrate region 20 is etched back to a surface region 20a', thereby uncovering the corresponding structure of the lamella L.

In principle, in the context of such an etching step, it is possible to form a multiplicity of lamellae that are spaced apart parallel and equidistantly in the manner of a bar grating on the surface region 20a or 20a' of the semiconductor substrate region 20, for example, in the context of a fabrication method for simultaneously producing a multiplicity of charge trapping gate memory cells of a semiconductor memory device.

Figure 3B:
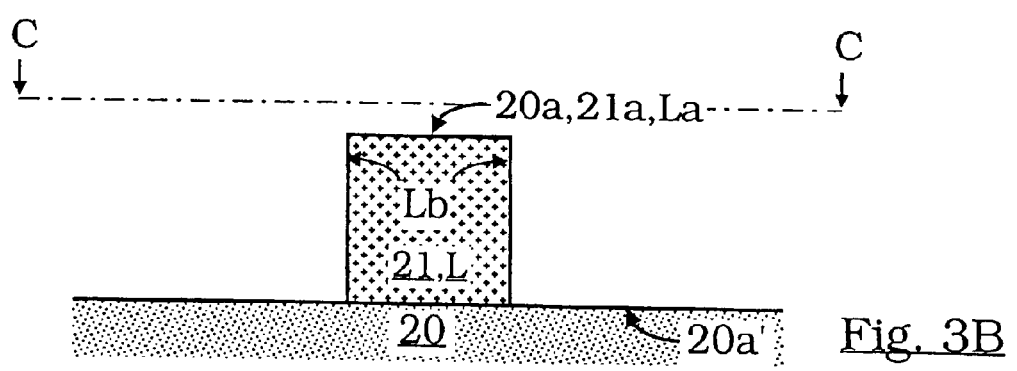
FIG. 3B is a cross-sectional side view of an intermediate state reached in the fabrication method according to the invention along the sectional plane B—B of FIG. 3C.
Figure 3C:
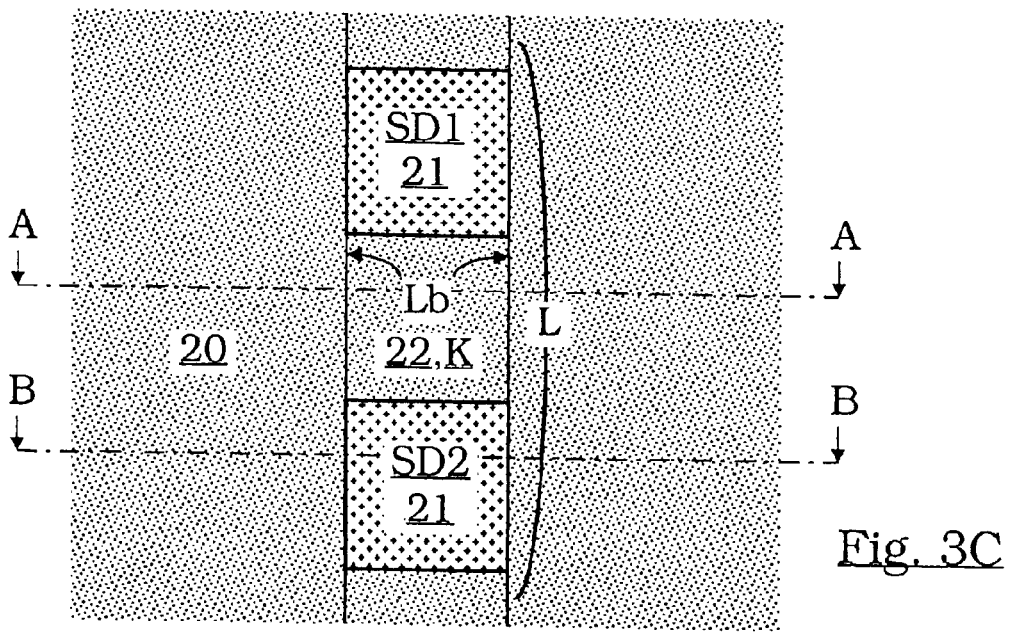
FIG. 3C is a cross-sectional plan view of an intermediate state reached in the fabrication method according to the invention along the sectional plane C—C of FIGS. 3A and 3B.

As emerges from FIG. 3B, the semiconductor material region or semiconductor substrate region 20 is etched back to form the main regions or lamellae L by a depth that approximately corresponds to the depth of the doping or implantation in the doping regions 21. If appropriate, an overetching may also take place to better separate the doped regions from one another.

The remaining regions SD1, SD2 of the doping regions 21 serve as source/drain regions SD1, SD2 of the source/drain configuration SD. In between lies the region 22, the channel region K.

Figure 4A:
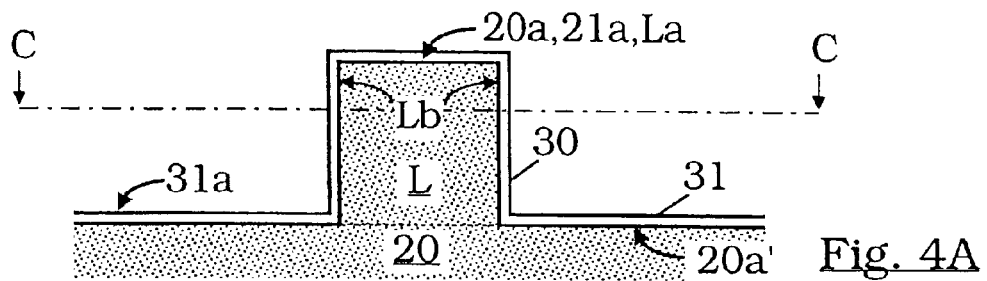
FIG. 4A is a cross-sectional side view of an intermediate state reached in the fabrication method according to the invention along the sectional plane A—A of FIG. 4C.
Figure 4B:
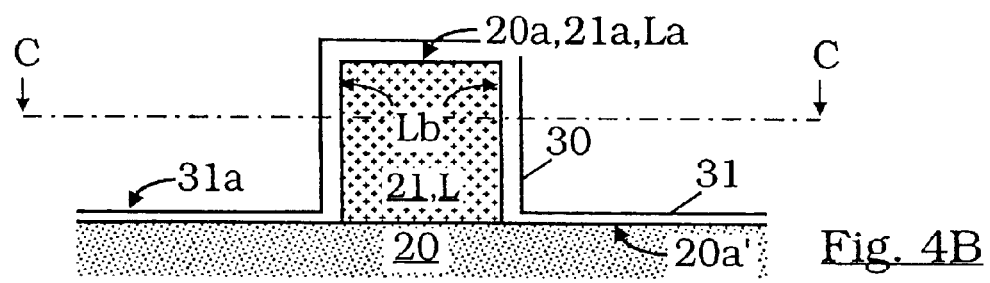
FIG. 4B is a cross-sectional side view of an intermediate state reached in the fabrication method according to the invention along the sectional plane B—B of FIG. 4C.
Figure 4C:
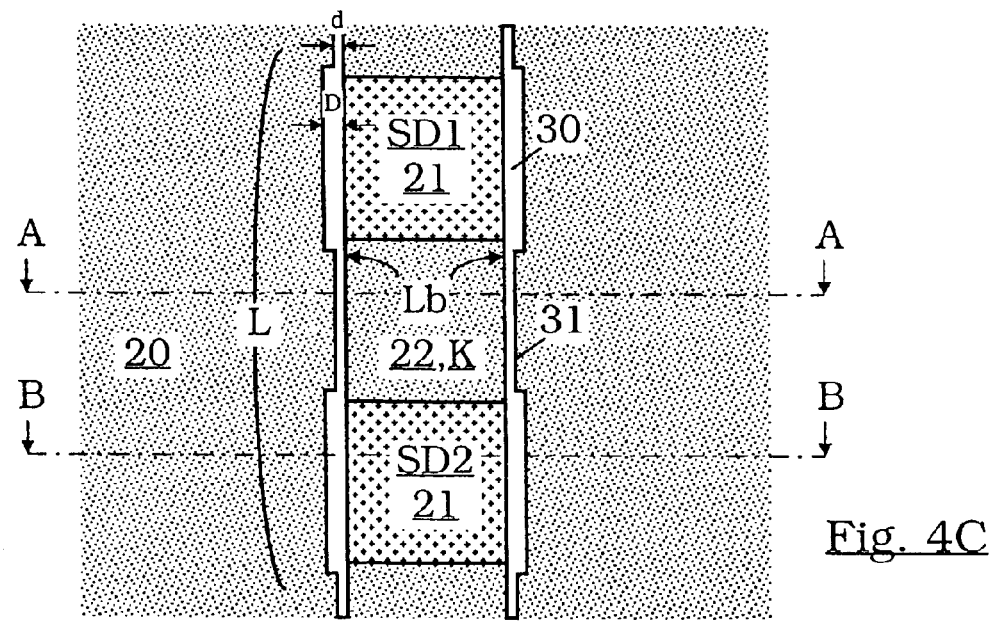
FIG. 4C is a cross-sectional plan view of an intermediate state reached in the fabrication method according to the invention along the sectional plane C—C of FIGS. 4A and 4B.

In the transition to the state of FIGS. 4A to 4C, an insulation layer 31 is then formed over the whole area and/or conformally, for example, by growth or deposition. In such a case, at the side regions Lb of the lamellae L, insulation regions 30 are produced as part of the insulation layer 31, which substantially extend vertically there and serve for insulating the charge trapping gates to be formed from the channel region 22 and from the doping regions 21.

The insulation layer 31 can be formed strictly conformally or else, as revealed in the comparison of FIGS. 4A to 4C, be formed with a larger layer thickness D in the region of the doping regions 21 compared with the otherwise thinner layer thickness d. The larger layer thickness D results quite automatically in the case of thermal oxidation and in the case of high dopings, for example, in the case of $n^+$-type silicon, and has the advantage that a lower capacitance is, thus, present between control gate G1, G2 and respective source/drain region SD1 or SD2.

Figure 5A:
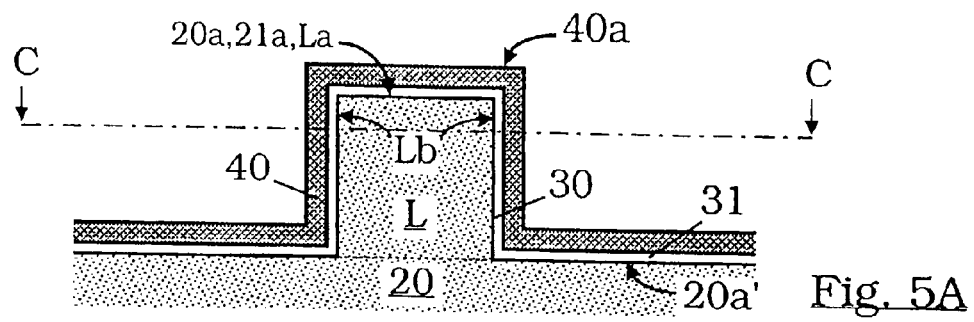
FIG. 5A is a cross-sectional side view of an intermediate state reached in the fabrication method according to the invention along the sectional plane A—A of FIG. 5C.
Figure 5B:
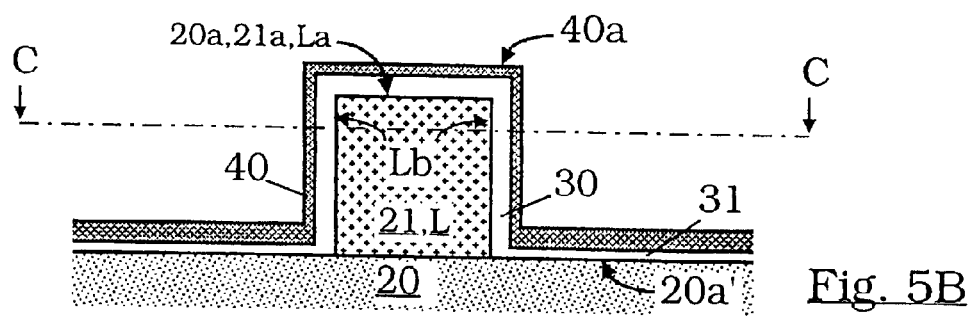
FIG. 5B is a cross-sectional side view of an intermediate state reached in the fabrication method according to the invention along the sectional plane B—B of FIG. 5C.
Figure 5C:
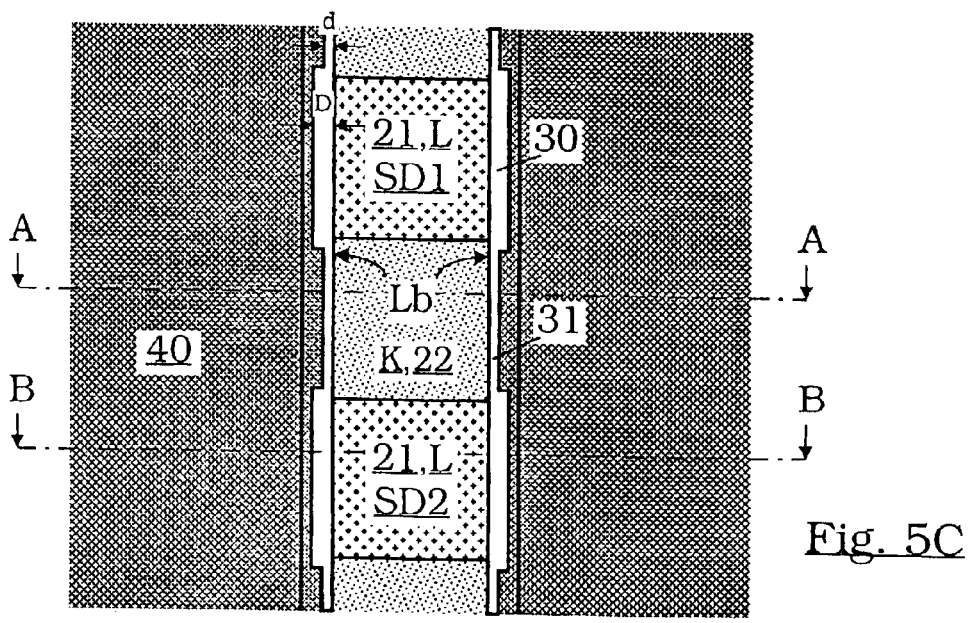
FIG. 5C is a cross-sectional plan view of an intermediate state reached in the fabrication method according to the invention along the sectional plane C—C of FIGS. 5A and 5B.

A material layer 40 for the charge trapping gates C1, C2 (see, i.e., FIGS. 7A to 7C) of the charge trapping gate configuration C that are to be formed is applied in a manner directly adjoining the insulation layer 30 and 31, in particular, by deposition. The material layer 40 is a so-called charge trapping layer. In such a case, an NO structure 40 was used in the intermediate state of the fabrication method according to the invention as shown in FIGS. 5A to 5C. The deposition or formation of such a charge trapping layer for the charge trapping gates C1, C2 is effected over the whole area. The actual charge trapping gates C1, C2 of the charge trapping gate configuration C are formed by the regions E11, . . . , E22 (see, i.e., FIGS. 8A to 8C) or overlap regions of the material region 40 with the source/drain regions SD1, SD2.

In the illustrated embodiment of the fabrication method according to the invention, the material region 40 is not explicitly patterned into the charge trapping gates C1, C2.

Additional insulation toward the control gates G1, G2 (see, i.e., FIGS. 7A to 7C) to be formed that would go beyond the oxide of an ONO or NO structure is also not provided.

Figure 6A:
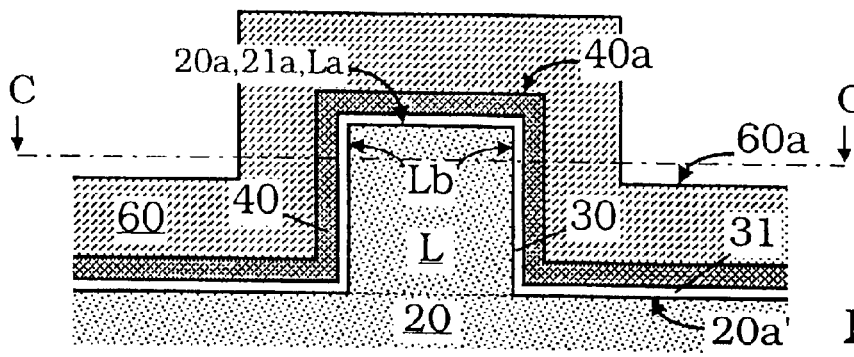
FIG. 6A is a cross-sectional side view of an intermediate state reached in the fabrication method according to the invention along the sectional plane A—A of FIG. 6C.
Figure 6B:
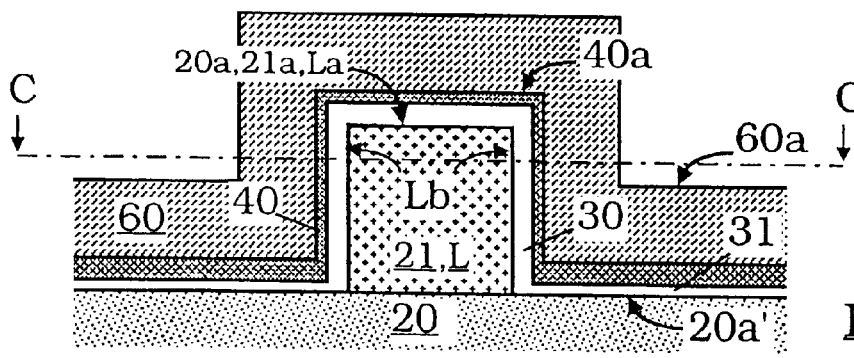
FIG. 6B is a cross-sectional side view of an intermediate state reached in the fabrication method according to the invention along the sectional plane B—B of FIG. 6C.
Figure 6C:
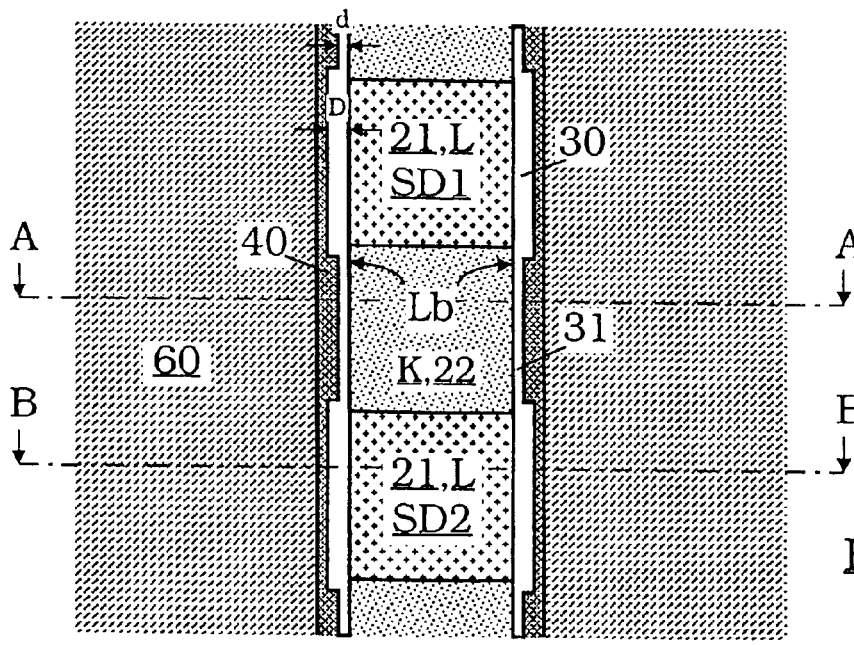
FIG. 6C is a cross-sectional plan view of an intermediate state reached in the fabrication method according to the invention along the sectional plane C—C of FIGS. 6A and 6B.

Specifically, the deposition of a material region 60 for the control gates G1 and G2 to be formed then takes place directly afterward. The intermediate state shown in FIGS. 6A to 6C is a whole-area polysilicon deposition. If appropriate, a deposition of polycide, metal, and/or the like is conceivable.

Figure 7A:
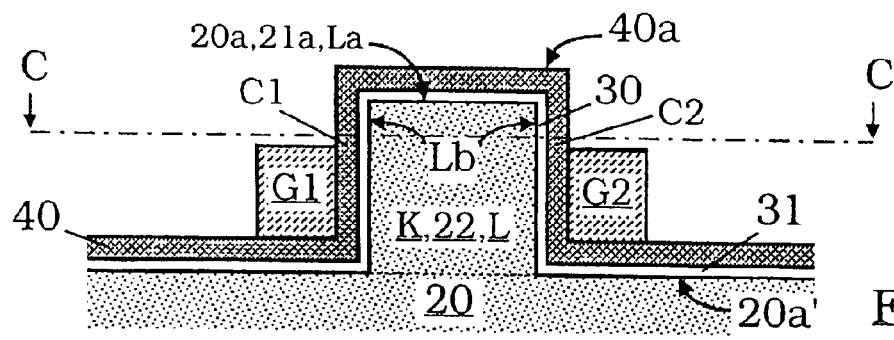
FIG. 7A is a cross-sectional side view of an intermediate state reached in the fabrication method according to the invention along the sectional plane A—A of FIG. 7C.
Figure 7B:
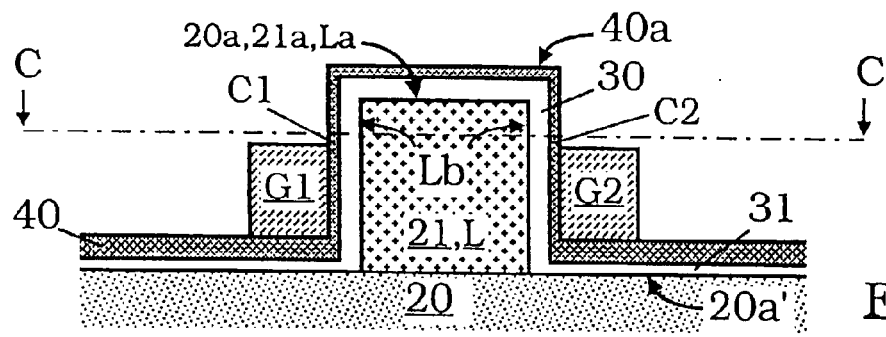
FIG. 7B is a cross-sectional side view of an intermediate state reached in the fabrication method according to the invention along the sectional plane B—B of FIG. 7C.
Figure 7C:
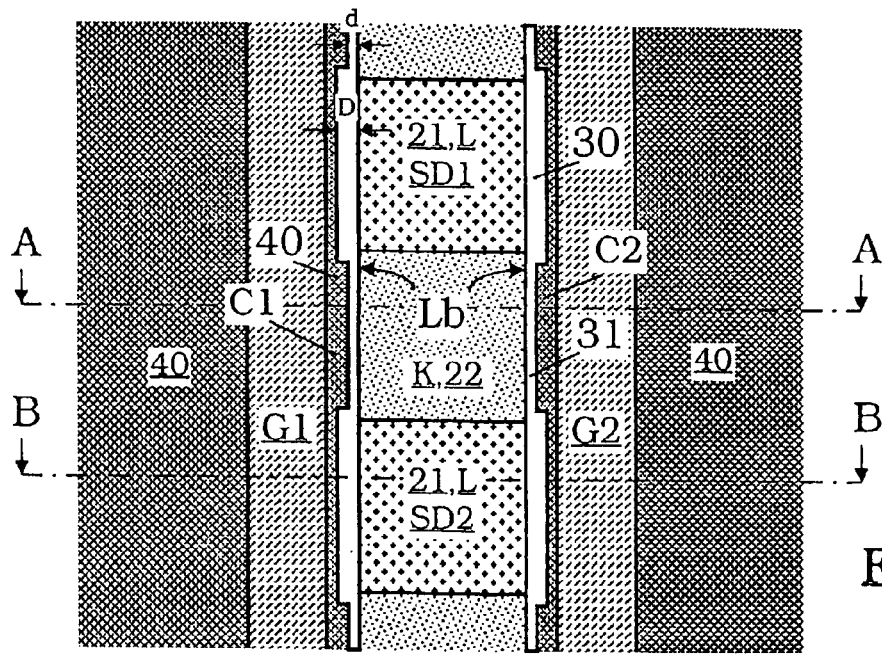
FIG. 7C is a cross-sectional plan view of an intermediate state reached in the fabrication method according to the invention along the sectional plane C—C of FIGS. 7A and 7B.

In the transition to the intermediate state shown in FIGS. 7A to 7C, the control gates G1 and G2 are, then, patterned. The patterning is done by whole-area anisotropic etching back so that the material 60 for the control gates G1 and G2 remains only at the edge of the lamella L adjacent to the charge trapping gates C1 and C2. A significant overetching is provided in the embodiment illustrated. This is not necessary, however, with the use of source/drain contacts.

In the edge region, a masked etching is additionally necessary to isolate the control gates G1, G2. These processes are not explicitly illustrated here.

Figure 8A:
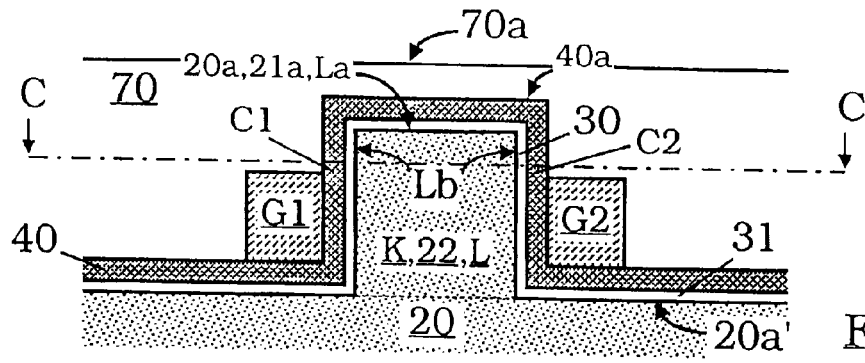
FIG. 8A is a cross-sectional side view of an intermediate state reached in the fabrication method according to the invention along the sectional plane A—A of FIG. 8C.
Figure 8B:
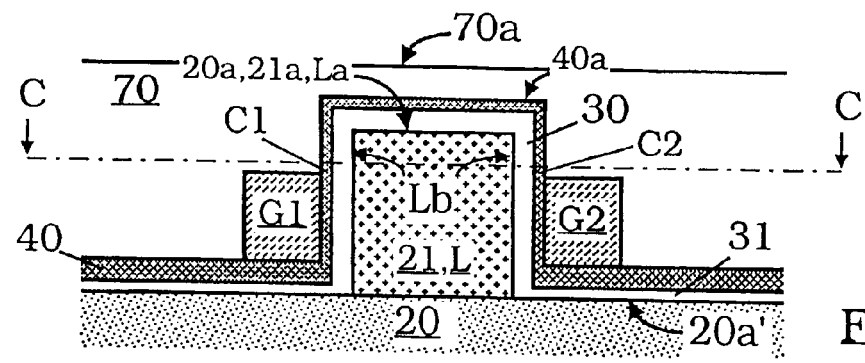
FIG. 8B is a cross-sectional side view of an intermediate state reached in the fabrication method according to the invention along the sectional plane B—B of FIG. 8C.
Figure 8C:
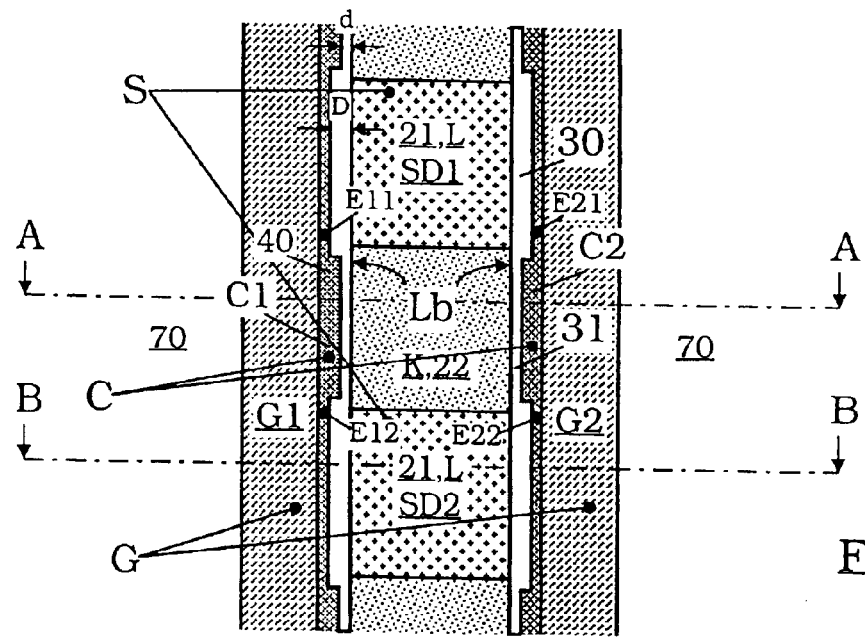
FIG. 8C is a cross-sectional plan view of an intermediate state reached in the fabrication method according to the invention along the sectional plane C—C of FIGS. 8A and 8B.

In the transition to the intermediate state shown in FIGS. 8A to 8C, embedding in an insulation region 70, for example, in the form of a silicon dioxide, is, then, effected.

The above-described patterning has, thus, produced a charge trapping gate memory cell 10 in which a charge trapping gate region C has two charge trapping gates C1 and C2 that are spatially separate from one another, in which a control gate region G has control gates G1 and G2 that are spatially separate from one another and face the respective charge trapping gates C1 and C2, and in which the source/drain region SD has common first and second source/drain regions SD1, SD2 for both gate structures.

As a rule, such a procedure does not produce a single charge trapping gate memory cell 10 locally, but rather, in a spatially extended semiconductor substrate region 20, a multiplicity of charge trapping memory cells or charge trapping gate memory cells 10 disposed in matrix form for forming a semiconductor memory device according to the invention for nonvolatile information storage.

In principle, two different process implementations are conceivable for the respective contact connection of the source/drain regions SD1 and SD2.

To obtain a cell area that is as small as possible, a lithographic definition of contact holes is dispensed with. The removal of the insulation layers 70, 31 above the source/drain regions SD1 and SD2 is effected either by chemical mechanical polishing or CMP with a stop on the surfaces of the source/drain regions or by etching. Such a procedure is illustrated in FIGS. 9A to 10C.

Figure 9A:
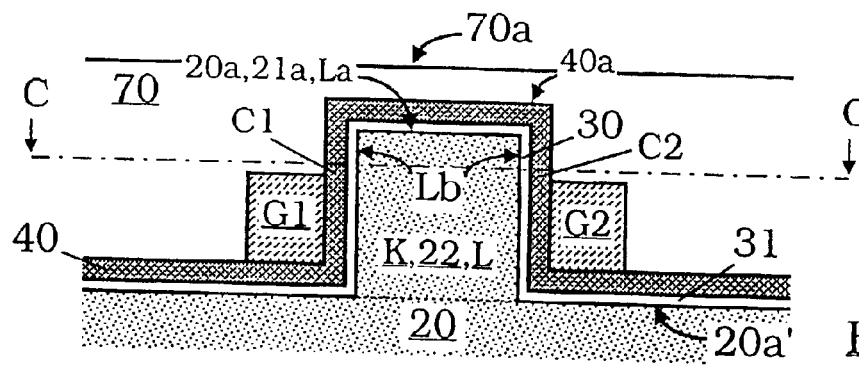
FIG. 9A is a cross-sectional side view of an intermediate state reached in the fabrication method according to the invention along the sectional plane A—A of FIG. 9C.
Figure 9B:
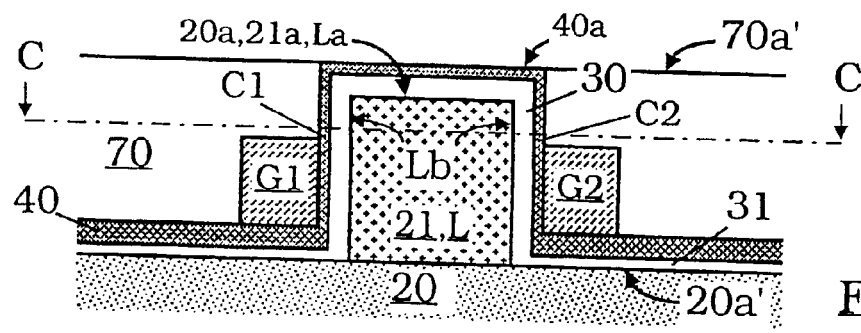
FIG. 9B is a cross-sectional side view of an intermediate state reached in the fabrication method according to the invention along the sectional plane B—B of FIG. 9C.
Figure 9C:
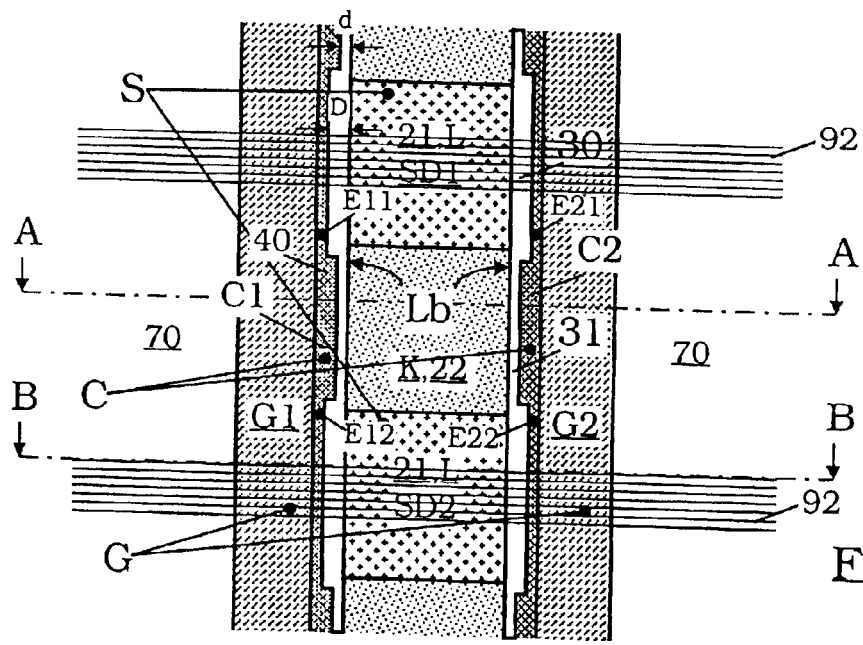
FIG. 9C is a cross-sectional plan view of an intermediate state reached in the fabrication method according to the invention along the sectional plane C—C of FIGS. 9A and 9B.

As is shown in the state of FIGS. 9A to 9C, strip-like free etching is effected by a mask configuration for the bit lines or source/drain line devices.

Figure 10A:
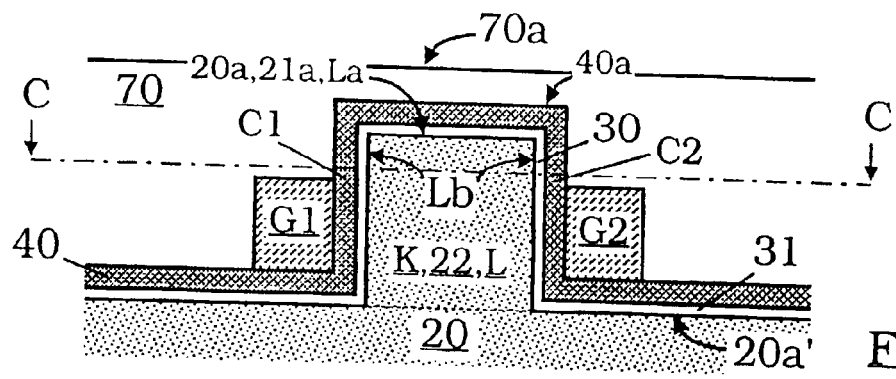
FIG. 10A is a cross-sectional side view of an intermediate state reached in the fabrication method according to the invention along the sectional plane A—A of FIG. 10C illustrating a first embodiment of the contact connection process.
Figure 10B:
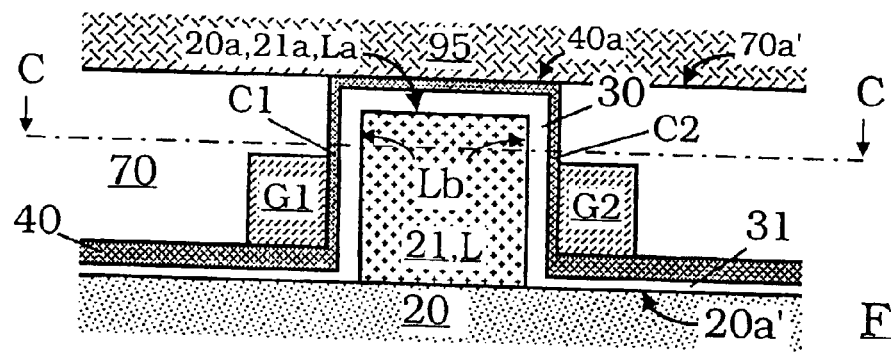
FIG. 10B is a cross-sectional side view of an intermediate state reached in the fabrication method according to the invention along the sectional plane B—B of FIG. 10C illustrating the first embodiment of the contact connection process.
Figure 10C:
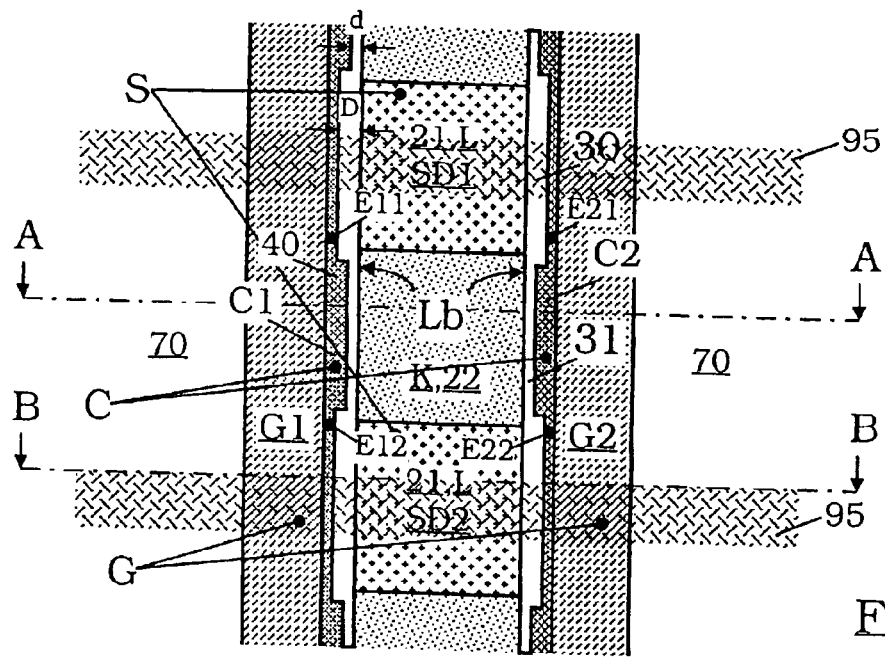
FIG. 10C is a cross-sectional plan view of an intermediate state reached in the fabrication method according to the invention along the sectional plane C—C of FIGS. 10A and 10B illustrating the first embodiment of the contact connection process.

In the transition to the intermediate state shown in FIGS. 10A to 10C, a whole-area metal deposition is, then, effected for the purpose of contact connection, the recesses 92 in the regions 70, 40, 30, 31 to the source/drain regions SD1, SD2 being filled with a corresponding metal 95. Electrical insulations of these fillings 95 are, then, isolated from one another by etching back or polishing with a stop on the surface 70a of the embedding insulation region 70.

In a different contact connection process, to obtain a large process window and to avoid major overetching, if appropriate, of the charge trapping gates C1 and C2 and of the control gates G1 and G2, a contact connection to the source/drain regions SD1 and SD2 is provided. Such a procedure is illustrated in FIGS. 11A to 12B.

Figure 11A:
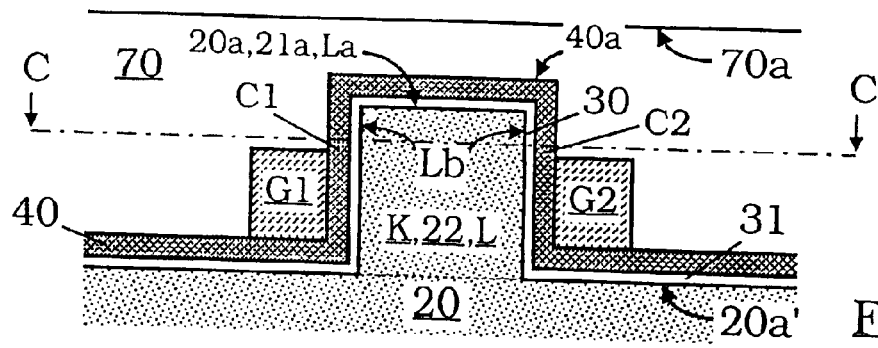
FIG. 11A is a cross-sectional side view of an intermediate state reached in the fabrication method according to the invention along the sectional plane A—A of FIG. 11C illustrating a second embodiment of the contact connection process.
Figure 11B:
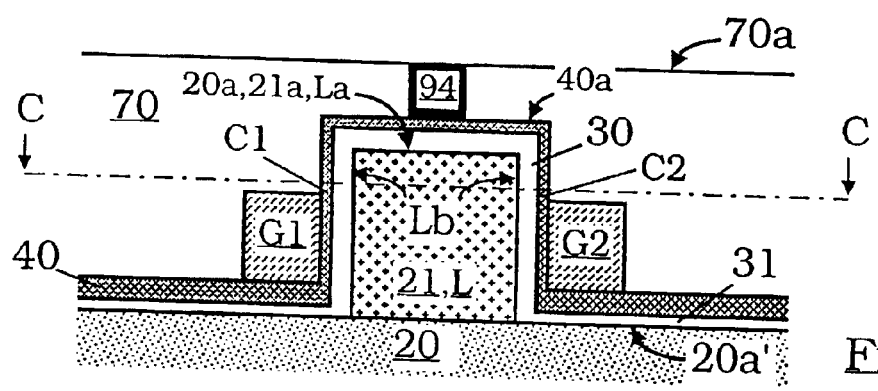
FIG. 11B is a cross-sectional side view of an intermediate state reached in the fabrication method according to the invention along the sectional plane B—B of FIG. 11C illustrating the second embodiment of the contact connection process.
Figure 11C:
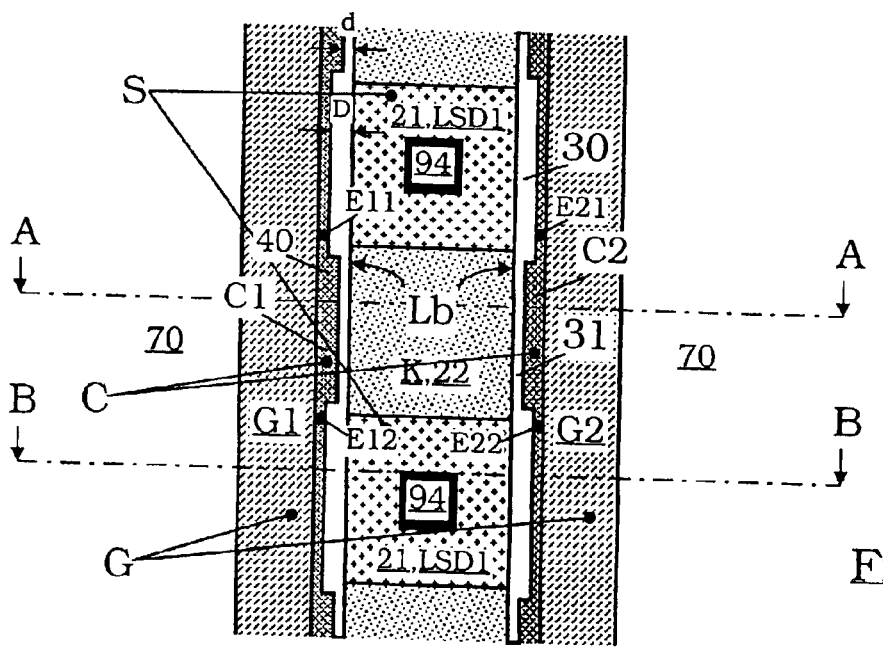
FIG. 11C is a cross-sectional plan view of an intermediate state reached in the fabrication method according to the invention along the sectional plane C—C of FIGS. 11A and 11B illustrating the second embodiment of the contact connection process.
Figure 12A:
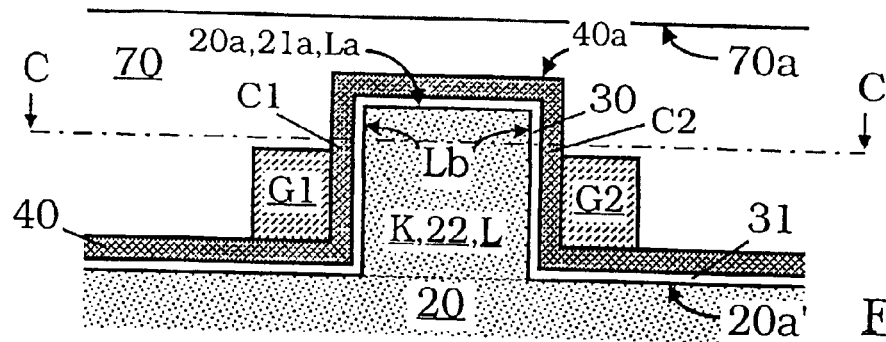
FIG. 12A is a cross-sectional side view of an alternative embodiment of the contact connection process according to the invention along the sectional plane A—A of FIG. 12C illustrating the second embodiment of the contact connection process.
Figure 12B:
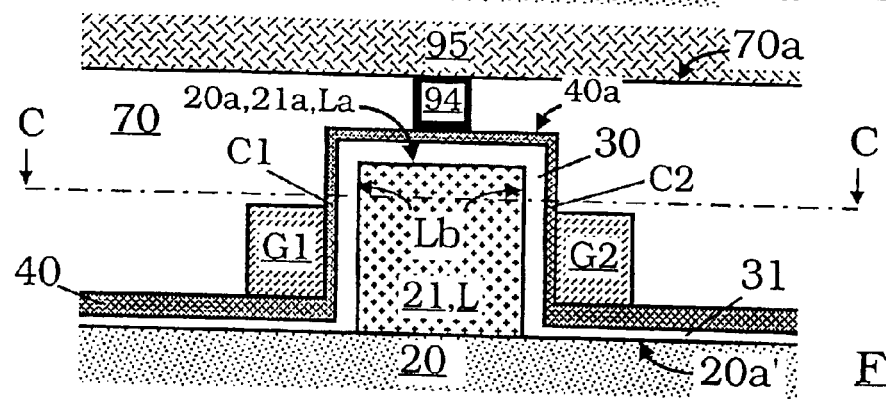
FIG. 12B is a cross-sectional side view of the alternative embodiment of the contact connection process according to the invention along the sectional plane B—B of FIG. 12C illustrating the second embodiment of the contact connection process.
Figure 12C:
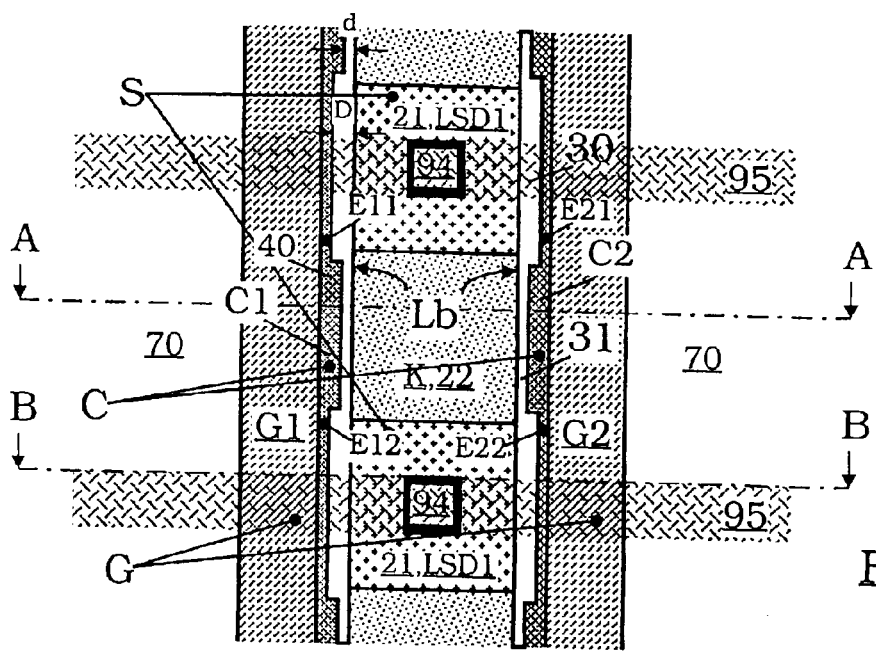
FIG. 12C is a cross-sectional plan view of the alternative embodiment of the contact connection process according to the invention along the sectional plane C—C of FIGS. 12A and 12B illustrating the second embodiment of the contact connection process.

FIGS. 11A to 11C thereof first illustrate the formation of contact holes with a corresponding metallic filling 94 of the contact holes. A significant overetching, if appropriate, of the charge trapping gates C1 and C2 or of the control gates G1 and G2 is not necessary in such a case. In the transition to the intermediate state shown in FIGS. 12A to 12C, a metal deposition 95 is, then, once again, carried out to form bit lines and source lines. The metal layer can be patterned jointly with the contacts using a dual damascene technique.

With the use of contactless architecture, metal interconnects can be completely dispensed with. Exclusively the buried bit lines and source lines are, then, used.

In the last-mentioned case, the lamella is not etched out to a depth such that the doping regions/diffusion regions for the source/drain regions would, thereby, be electrically isolated.

I claim:

1. A charge trapping memory cell for nonvolatile storage of information including at least one of information units and binary bits, comprising:

a charge trapping gate configuration for storing the information, said charge trapping gate configuration having charge trapping gates each substantially independently storing the information and, as a result, storing a corresponding plurality of one of the information units and binary bits independently of one another in the memory cell;

a source/drain configuration accessing said charge trapping gate configuration; and a control gate configuration controlling access to said charge trapping gate configuration.

2. The charge trapping memory cell according to claim 1, wherein:
said control gate configuration has control gates;
a respective one of said control gates is associated with a respective one of said charge trapping gates; and
each one of said control gates controls access to an associated one of said charge trapping gates.

3. The charge trapping memory cell according to claim 1, wherein said source/drain configuration has two source/drain regions jointly provided for at least one of said charge trapping gates and said control gates to permit access of all of said charge trapping gates through said two common source/drain regions.

4. The charge trapping memory cell according to claim 1, wherein:
said charge trapping gates have at least one of geometrical properties and material properties; and
said charge trapping gates are substantially identical with regard to at least one of said geometrical properties and said material properties.

5. The charge trapping memory cell according to claim 1, wherein said charge trapping gates are disposed and configured in a manner substantially electrically insulated from one another, from said control gates, and from said source/drain regions.

6. The charge trapping memory cell according to claim 1, wherein:
said control gates have at least one of geometrical properties and material properties; and
said control gates are configured substantially identically with regard to said geometrical properties and said material properties.

7. The charge trapping memory cell according to claim 1, wherein said control gates are disposed and configured in a manner substantially electrically insulated from one another, from said charge trapping gates, and from said source/drain regions.

8. The charge trapping memory cell according to claim 1, wherein said control gates are selected from at least one of the group consisting of a polysilicon material, a polycide, and a metal.

9. The charge trapping memory cell according to claim 1, wherein said charge trapping gates one of:
are of a material in which charge trapping states can be formed; and
have a material in which charge trapping states can be formed.

10. The charge trapping memory cell according to claim 9, wherein said material is an insulator one of having and forming a density of defects able to be occupied by at least one of electrons and holes.

11. The charge trapping memory cell according to claim 8, wherein said charge trapping gates one of:
are of silicon nitride; and
have silicon nitride.

12. The charge trapping memory cell according to claim 11, wherein said charge trapping gates have one of an ONO structure and a NO structure.

13. The charge trapping memory cell according to claim 8, wherein said charge trapping gates are of at least one of the group consisting of $Al_2O_3$, $Ta_2O_5$, and $HfO_2$.

14. The charge trapping memory cell according to claim 2, wherein:
said charge trapping gates and said control gates respectively assigned to one another are in direct spatial proximity to one another; and
one of an intermediate insulation region and an intermediate dielectric is provided with said charge trapping gates and said control gates respectively assigned to one another.

15. The charge trapping memory cell according to claim 1, wherein:
each of said charge trapping gates has a first end region and a second end region; and
a respective first end region is configured and disposed in direct spatial proximity to said first source/drain region and a respective second end region is configured and disposed in direct spatial proximity to said second source/drain region to form, thereby, at least one of a spatial overlap and an areal overlap between said charge trapping gates and said source/drain regions.

16. The charge trapping gate memory cell according to claim 15, wherein:
a material for forming charge trapping states is disposed in a region of said first and second end regions; and
a material region with no charge trapping states is disposed in a region between said respective end regions of a respective one of said charge trapping gates.

17. The charge trapping memory cell according to claim 16, including an insulation region disposed between a respective one of said charge trapping gates and said source/drain regions.

18. The charge trapping memory cell according to claim 17, wherein said insulation region is of a silicon dioxide material.

19. The charge trapping memory cell according to claim 1, wherein:
each of said charge trapping gates has a first end region and a second end region; and
a respective first end region is configured and disposed in direct spatial proximity to said first source/drain region and a respective second end region is configured and disposed in direct spatial proximity to said second source/drain region to form, thereby, at least one of a spatial overlap and an areal overlap between respective end regions of said charge trapping gates and said source/drain regions.

20. The charge trapping gate memory cell according to claim 19, wherein:
a material for forming charge trapping states is disposed in a region of said first and second end regions; and
a material region with no charge trapping states is disposed in a region between said respective end regions of a respective one of said charge trapping gates.

21. The charge trapping memory cell according to claim 20, including an insulation region disposed between a respective one of said end regions of said charge trapping gates and said source/drain regions.

22. The charge trapping memory cell according to claim 21, wherein said insulation region is of a silicon dioxide material.

23. The charge trapping memory cell according to claim 1, including one of the group consisting of an elevated region, a lamella, a web, and a burr of a semiconductor material region as a main region of the charge trapping cell.

24. The charge trapping memory cell according to claim 23, wherein:
one of said main region and said lamella has side regions;
said charge trapping gates are disposed in a region of said side regions opposite one another with said main region between said charge trapping gates;

said main region is in direct spatial proximity to said charge trapping gates; and said charge trapping gates have a respective insulation region disposed toward said main region.

25. The charge trapping memory cell according to claim 24, wherein two of said charge trapping gates are disposed in a region of said side regions opposite one another with said main region between said charge trapping gates.

26. The charge trapping memory cell according to claim 25, wherein:

said main region has channel region; and said source/drain regions are one of $n^+$-doped and $p^+$-doped—regions of said main region isolated by said channel region.

27. A charge trapping memory cell for nonvolatile storage of information including at least one of information units and binary bits, comprising:

a charge trapping gate configuration for storing the information, said charge trapping gate configuration having charge trapping gates each substantially independently storing the information and, as a result, storing a corresponding plurality of one of the information units and binary bits independently of one another in the memory cell;

a source/drain configuration connected to said charge trapping gate configuration and accessing said charge trapping gate configuration; and a control gate configuration connected to said charge trapping gate configuration and controlling access to said charge trapping gate configuration.

28. A semiconductor memory device, comprising:

charge trapping gate memory cells for nonvolatile storage of information including at least one of information units and binary bits, each of said memory cells having:

a charge trapping gate configuration having charge trapping gates each substantially independently storing the information and, as a result, storing a corresponding plurality of one of the information units and binary bits independently of one another in the memory cells;

a source/drain configuration accessing said charge trapping gate configuration; and a control gate configuration controlling access to said charge trapping gate configuration.

29. The semiconductor memory device according to claim 28, wherein at least some of said control gates in adjacent ones of said memory cells are common control gates.

30. The semiconductor memory device according to claim 28, wherein said memory cells are configured and disposed in a matrix and on a plurality of substantially identical main regions.

31. The semiconductor memory device according to claim 30, wherein said main regions are one of the group consisting of lamellae, webs, and burrs.

32. The semiconductor memory device according to claim 31, wherein said main regions extend linearly and equidistantly with respect to one another.

33. The semiconductor memory device according to claim 32, wherein said main regions are at least one of columns and rows of said matrix of said memory cells.

34. A method for fabricating a charge trapping memory cell for nonvolatile storage of information, which comprises:

providing a charge trapping gate configuration for storing information including at least one of information units and binary bits, the charge trapping gate configuration having charge trapping gates each storing the information substantially independently of one another in the memory cell and, as a result, storing the information independently of one another in the memory cell;

accessing the charge trapping gate configuration with a source/drain configuration; and controlling the access to the charge trapping gate configuration with a control gate configuration.

35. The method according to claim 34, wherein the control gate configuration has control gates and a respective one of the control gates is associated with a respective one of the charge trapping gates, and which further comprises controlling access to the associated one of the charge trapping gates with each respective control gate.

36. The method according to claim 35, wherein:

the source/drain configuration has two source/drain regions; and the source/drain regions are jointly provided jointly for at least one of the charge trapping gates and the control gates to permit access of all of the charge trapping gates through the two common source/drain regions.

37. The method according to claim 34, which comprises configuring the charge trapping gates substantially identically with respect to at least one of geometrical properties and material properties of the charge trapping gates.

38. The method according to claim 34, which comprises placing and configuring the charge trapping gates in a manner substantially electrically insulated from one another, from the control gates, and from the source/drain regions.

39. The method according to claim 34, which comprises configuring the control gates substantially identically with respect to at least one of geometrical properties and material properties of the control gates.

40. The method according to claim 34, which comprises placing and configuring the control gates in a manner substantially electrically insulated from one another, from the charge trapping gates, and from the source/drain regions.

41. The method according to claim 34, which comprises forming the control gates from a polysilicon material.

42. The method according to claim 41, wherein the charge trapping gates are formed one of:

from silicon nitride; and with silicon nitride.

43. The method according to claim 42, wherein the charge trapping gates have one of an ONO structure and a NO structure.

44. The method according to claim 41, wherein the charge trapping gates are of at least one of the group consisting of $Al_2O_3$, $Ta_2O_5$, and $HfO_2$.

45. The method according to claim 34, which further comprises forming the charge trapping gates with a material in which charge trapping states can be formed.

46. The method according to claim 45, wherein the material is an insulator able to form a density of defects able to be occupied by at least one of electrons and holes.

47. The method according to claim 34, which comprises providing the charge trapping gates and the control gates respectively assigned to one another in direct spatial proximity to one another and with an intermediate insulation region in each case.

48. The method according to claim 47, wherein the intermediate insulation region is an intermediate dielectric.

49. The method according to claim 34, which further comprises:

configuring each of the charge trapping gates with a first end region and a second end region;

placing and configuring a respective first end region in direct spatial proximity to the first source/drain region and placing and configuring a respective second end region in direct spatial proximity to the second source/drain region to form at least one of a spatial overlap and an areal overlap between the charge trapping gates and the source/drain regions.

50. The method according to claim 49, which further comprises providing an insulation region between the respective one of the charge trapping gates and the source/drain regions.

51. The method according to claim 50, wherein the insulation region is of a silicon dioxide material.

52. The method according to claim 34, which further comprises:
configuring each of the charge trapping gates with a first end region and a second end region;
placing and configuring a respective first end region in direct spatial proximity to the first source/drain region and placing and configuring a respective second end region in direct spatial proximity to the second source/drain region to form at least one of a spatial overlap and an areal overlap between the respective end regions of the charge trapping gates, and the source/drain regions.

53. The method according to claim 52, which further comprises providing an insulation region between the respective one of the end regions of the charge trapping gates, and the source/drain regions.

54. The method according to claim 53, wherein the insulation region is of a silicon dioxide material.

55. The method according to claim 34, which further comprises providing an elevated region of a semiconductor material region as a main region of the charge trapping cell.

56. The method according to claim 55, wherein the elevated region is one of the group consisting of a lamella, a web, and a burr.

57. The method according to claim 56, which further comprises:
providing the main region with side regions; and
providing the charge trapping gates in a region of the side regions.

58. The method according to claim 57, which further comprises providing two charge trapping gates in a region of the side regions.

59. The method according to claim 58, which further comprises providing the charge trapping gates opposite one another with the main region therebetween.

60. The method according to claim 59, which further comprises providing the charge trapping gates in direct spatial proximity to the main region with an insulation region between the charge trapping gates facing toward the main region.

61. The method according to claim 60, wherein the main region is a lamella.

62. The method according to claim 60, which further comprises:
providing the main region with channel region; and
configuring the source/drain regions as one of $n^+$-doped regions and $p^+$-doped regions of the main region, isolated by the channel region.

63. The method according to claim 56, wherein the main region is at least one of linear and approximately parallelepipedal.

64. The method according to claim 57, which further comprises:
first providing a semiconductor substrate region;
subsequently forming doping regions locally for the source/drain regions; and
subsequently forming the main region for the memory cell by etching back surroundings in the semiconductor substrate region.

65. The method according to claim 64, wherein the semiconductor substrate region is one of p-doped silicon and n-doped silicon, and which further comprises:
forming the doping regions by implantation, the doping regions being at least one of:
$n^+$-doped doping regions or $p^+$-doped doping regions; and
disposed in a first strip; and
forming the main region at least one of with a masking process and in a second strip transverse with respect to the first strip.

66. The method according to claim 65, which further comprises subsequently one of forming and depositing substantially conformally an insulating layer.

67. The method according to claim 66, wherein the insulating layer is at least one of:
a silicon dioxide material; and
for the insulation region between the main region and the charge trapping gates.

68. The method according to claim 67, wherein the insulation layer is formed by growing the insulating layer.

69. The method according to claim 68, which further comprises subsequently forming a material region for the charge trapping gates.

70. The method according to claim 69, wherein the material region for the charge trapping gates is formed by deposition.

71. The method according to claim 70, wherein the material region for the charge trapping gates is formed at least one of:
utilizing one of an ONO structure and a NO structure; and
providing an oxide at at least one of a top and a bottom of the material region.

72. The method according to claim 71, which further comprises subsequently patterning the charge trapping gates to have the material region for the charge trapping gates remain only in a region of the side regions of the main region.

73. The method according to claim 72, wherein the patterning step is performed by at least one of:
etching columns into the material region for the charge trapping gates, the columns running substantially perpendicular to an extent of the main region; and
one of subsequently removing and etching back the material region for the charge trapping gates to a point below a level of a surface region of the main region.

74. The method according to claim 73, which further comprises subsequently one of forming, depositing, and conformally depositing a material region substantially over an entire area of the memory cell.

75. The method according to claim 74, wherein the material region forms the insulation region between the associated ones of the charge trapping gates and the control gates.

76. The method according to claim 75, which further comprises subsequently one of forming, depositing, and conformally depositing a material region substantially over an entire area of the memory cell.

77. The method according to claim 75, which further comprises subsequently one of forming, depositing, and conformally depositing a material region for the control gates substantially over an entire area of the memory cell.

78. The method according to claim 77, which further comprises subsequently patterning the control gates to have the material region for the control gates remain only in a region of the side regions of the main region.

79. The method according to claim 78, which further comprises carrying out the patterning by patterning the control gates to not remove the material region for the intermediate insulation region.

80. The method according to claim 79, wherein the patterning of the control gates is performed by at least one of:
  mask etching at an edge of a memory matrix formed of columns in the material region for the control gates, the columns running substantially perpendicular to an extent of the main region; and
  one of subsequently removing and etching back the material region for the control gates to at least one of:
    a point below a level of a surface region of the material region for the charge trapping gates and
    a point below a level of the surface region of the material region for the intermediate insulation region.

81. The method according to claim 80, which further comprises:
  subsequently embedding a structure obtained in an insulation region; and
  subsequently forming a contact connection to at least one of the source/drain regions and the control gates.

82. The method according to claim 57,
  first providing a semiconductor substrate region;
  subsequently forming the main region for the memory cell by etching back surroundings in the semiconductor substrate region; and
  subsequently forming doping regions locally for the source/drain regions.

83. The method according to claim 82, wherein the semiconductor substrate region is one of p-doped silicon and n-doped silicon, and which further comprises:
  forming the main region at least one of using a masking process and in a first strip; and
  forming the doping regions as one of $n^+$-doped doping regions and $p^+$-doped doping regions at least one of:
    by implantation; and
    disposed in a second strip transverse with respect to the first strip.

* * * * *